United States Patent [19]

Meade et al.

[11] Patent Number: 5,021,984
[45] Date of Patent: Jun. 4, 1991

[54] TICKET ISSUING MACHINES

[75] Inventors: Roger Meade, Newark; Paul Schofield, Camberley; Michael C. Wright, Harrow, all of England

[73] Assignee: Almex Control Systems Limited, Middlesex, England

[21] Appl. No.: 560,492

[22] Filed: Jul. 23, 1990

Related U.S. Application Data

[63] Continuation of Ser. No. 456,054, Dec. 26, 1989, abandoned, which is a continuation of Ser. No. 82,008, Aug. 5, 1987, abandoned.

[30] Foreign Application Priority Data

Aug. 8, 1986 [GB] United Kingdom ............... 8619188

[51] Int. Cl.$^5$ .................................. G06F 3/00
[52] U.S. Cl. .................................. 364/709.16
[58] Field of Search ............ 364/709.06, 709.16, 364/709.15, 708, 405; 235/384; 341/22

[56] References Cited

U.S. PATENT DOCUMENTS

| | | | |
|---|---|---|---|
| 4,486,741 | 12/1984 | Nozawa et al. | 341/22 |
| 4,547,860 | 10/1985 | Lapeyre | 364/709.16 |
| 4,724,423 | 2/1988 | Kinoshita | 340/365 S |

FOREIGN PATENT DOCUMENTS

| | | |
|---|---|---|
| 0057080 | 8/1982 | European Pat. Off. . |
| 1547984 | 7/1979 | United Kingdom . |
| 1553570 | 10/1979 | United Kingdom . |
| 2140952 | 12/1984 | United Kingdom . |

Primary Examiner—Dale M. Shaw
Assistant Examiner—Tan V. Mai
Attorney, Agent, or Firm—Panitch Schwarze Jacobs & Nadel

[57] ABSTRACT

This invention has reference to a ticket issuing machine including a keyboard (3) to enter into the machine information about a ticket to be issued, a printer (5) to print out ticket information on a ticket, store circuits (15, 20, 21) for storing information about tickets being issued and with a circuit for alternating the information stored in the store circuits to control the operation of the printer 1. The keyboard 3 comprises a plurality of keys (3a) at least some of which bear more than one identification and that there are provided selection circuits capable of identifying which of the identifications is relevant to the particular syntax operation of the ticket machine.

4 Claims, 13 Drawing Sheets

START

| | |
|---|---|
| AAAA | BBBB |
| CC:CC | DDDDDD |
| I.D. | EEEE |
| ROUTE | FF |
| ORIGIN | GGGGG |
| TRAIN | HHHH |
| RUN | JJJJ |

FIG.10

*RECEIPT*

AAAAA

B B B B B B B

- - - - - - - - - - - - - - - -

B B B B B B B
$CCC.CC    $1.00
FARE       PENALTY
DD:DD      EEEEEEE
FFFF  HHHH  GGGG

FIG.12

RECAP

| | | |
|---|---|---|
| AAAA | | BBBB |
| CC:CC | | DDDDDD |
| ID | OOOO | EEEE |
| OW | TTTT | $FFFF·FF |
| SR/H | UUUU | $GGGG·GG |
| RT | WWWW | $IIII·II |
| SD | XXXX | $JJJJ·JJ |
| SE | YYYY | $KKKK·KK |
| M DB | | $LLLL·LL |
| M CR | | $MMMM·MM |
| REMIT | ZZZZ | $NNNN·NN |
| PENALTY | PPPP | |

FIG.11

TICKET ISSUING MACHINES

This is a continuation of application Ser. No. 456,054, filed Dec. 26, 1989, now abandoned, which is a continuation of application Ser. No. 082,008, filed Aug. 5, 1987, now abandoned.

This invention has reference to ticket issuing machines and has particular but not exclusive reference to ticket machines known as hand held ticket issuing machines which are used to issue tickets for travel by public transport more especially by omnibus or by railway. Such ticket issuing machines may however be used for other applications in which a ticket issuing machine is carried by a mobile operator. It has been known for many years to provide ticket issuing machines comprising various kinds of variations of a printing drum associated with print wheel mechanisms to enable variable information to be printed on the ticket and in which the print wheel mechanism was present to determine the data to be printed on the ticket. Such machines were carried for example by a conductor on board an omnibus. The ticket issuing machine had a supporting web attached to it so that the conductor could support the machine on his chest. The variable data to be printed on the ticket could relate to the kind of ticket (single, return period); the fare stage (either the stage of boarding or the stage at which the passenger was required to alight), the value of the ticket issued etc. In addition static information was printed on the ticket and this information might refer to the issuing authority and the sequence of the ticket and perhaps the date of issue of the ticket. In addition the ticket machines included registers to enable accumulative information such as the total number of tickets or the total value of tickets issued during a predetermined period to be displayed. Such registers usually showed an accumulative number which was checked as the conductor was issued with the ticket issuing machine at the start of a duty period and was rechecked at the end of the duty period also some ticket issuing machines were provided to issue preprinted tickets of predetermined denominations. Thus a series of webs of tickets were arranged in a machine each web being printed in a distinctive colour and each representing a certain ticket value on depression of a selected lever a single ticket of a predetermined value (depending upon which lever was depressed) was issued. The machine also included counter mechanisms to indicate the number of tickets of each value issued and the machine had a supporting web to enable the machine to be supported on the conductors chest.

In the specifications of British Patents Nos. 1553570 and 1547984 there is described a Ticket Issuing Machine for issuing tickets for totalizator betting applications and this machine includes a wire printer mechanism as well as a keyboard, a microprocessor and a matrix display. Information about bets laid etc. were recorded on a computer usually located at a distance from but connected to the individual ticket issuing machines. Such machines were not readily portable.

In the Specification of European Patent Application No. 82300282.9 (0057080) there is described a ticket issuing machine for transport undertakings and which comprise a ticket printing device, a paper feed device for feeding a ticket web past the printing device, a microprocessor means, a keyboard for entering data into the microprocessor means, a store for retaining information about information to be printed on a ticket which information can be transferred to the microprocessor means to control the ticket printing device under the control of the microprocessor means to determine the information to be printed on the ticket web, and a display panel for displaying information to be entered on the keyboard and information to be printed on the ticket and power means for driving the parts of the ticket issuing machine. This ticket issuing machine was intended primarily for "one man bus" applications. Such machines were not readily portable.

In the specification of British Patent No. 2140952 there is described a ticket issuing machine particularly for use with transport undertakings and a ticket issuing and printing device in which keys respectively associated with the numbers 0 to 9 can be operated in one mode to enter the associated digits for entering the price of a ticket and can be operated in a rapid issue mode to select a complete pre-programmed price associated therewith. In the rapid issue mode the operation of a key will also select a pre-programmed class of ticket. Likewise these machines were intended primarily for "one man bus" applications and the machines were not readily portable.

It is an object of the present invention to provide an improved ticket issuing machine.

It is a further object of the present invention to provide an improved ticket issuing machine which is capable of being readily portable so that they may be carried by a conductor or inspector aboard transport undertakings and may also be used in the issuing of betting tickets at race courses and issuing of tickets/receipts by Police.

It is a further object of the present invention to provide a ticket issuing machine embodying store circuits, processor circuits, data address circuits or gate circuits to enable a machine to be made which is readily portable. It is a further object of the invention to provide a ticket issuing machine capable of being able to enter a wide variety of control information into the machine for processing. According to one aspect of the present invention a ticket issuing machine comprises a keyboard (3), store circuits for storing information relevant to tickets to be issued, a printer (5) to print out ticket information on a ticket (6a) in accordance with information supplied to it, including information supplied by the store circuits, characterised in that the keyboard (3) comprises a plurality of keys 3a, at least some of which bear more than one identification, and that there are provided selective circuits capable of identifying which of the identifications is relevant to the particular syntax operation of the ticket machine.

According to another aspect of the present invention a ticket issuing machine includes a keyboard to enter into the machine information about a ticket to be issued, a printer to print out ticket information on a ticket, store circuits for storing information about tickets being issued and with means for altering the information stored in the store circuits and gate data address circuits to address the store circuits to control the operation of the printer in accordance with the information supplied to it by the store circuits, portable battery supply means for providing the power to drive the devices of the ticket issuing machine.

A portable ticket issuing machine for use in issuing tickets more especially by a conductor on a railway in accordance with the present invention will now be described by way of example with reference to the accompanying drawings wherein:

FIGS. 10-14 show various tickets printed by the machine.

Figure 1:
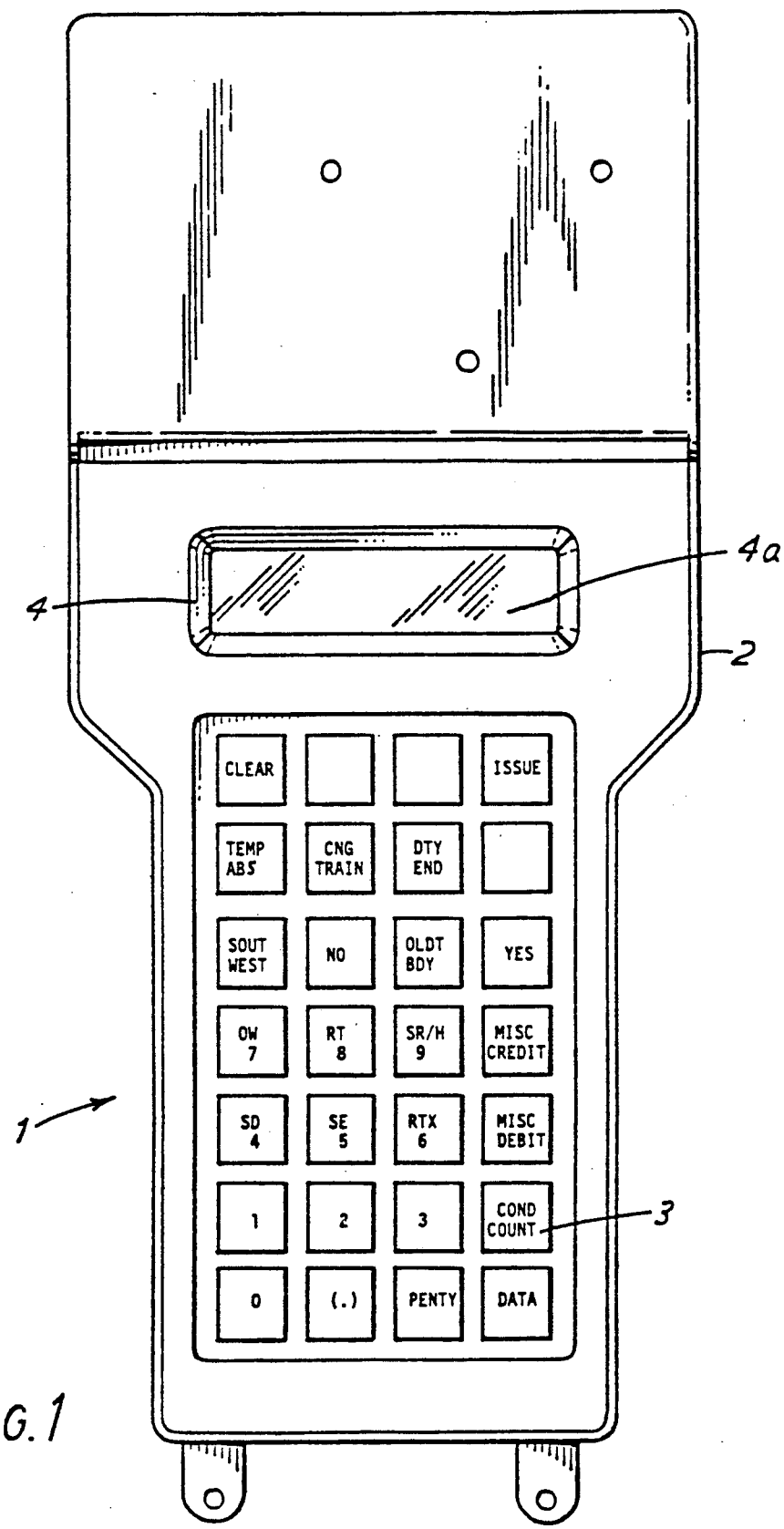
FIG. 1 is a plan view of the ticket issuing machine.
Figure 2:
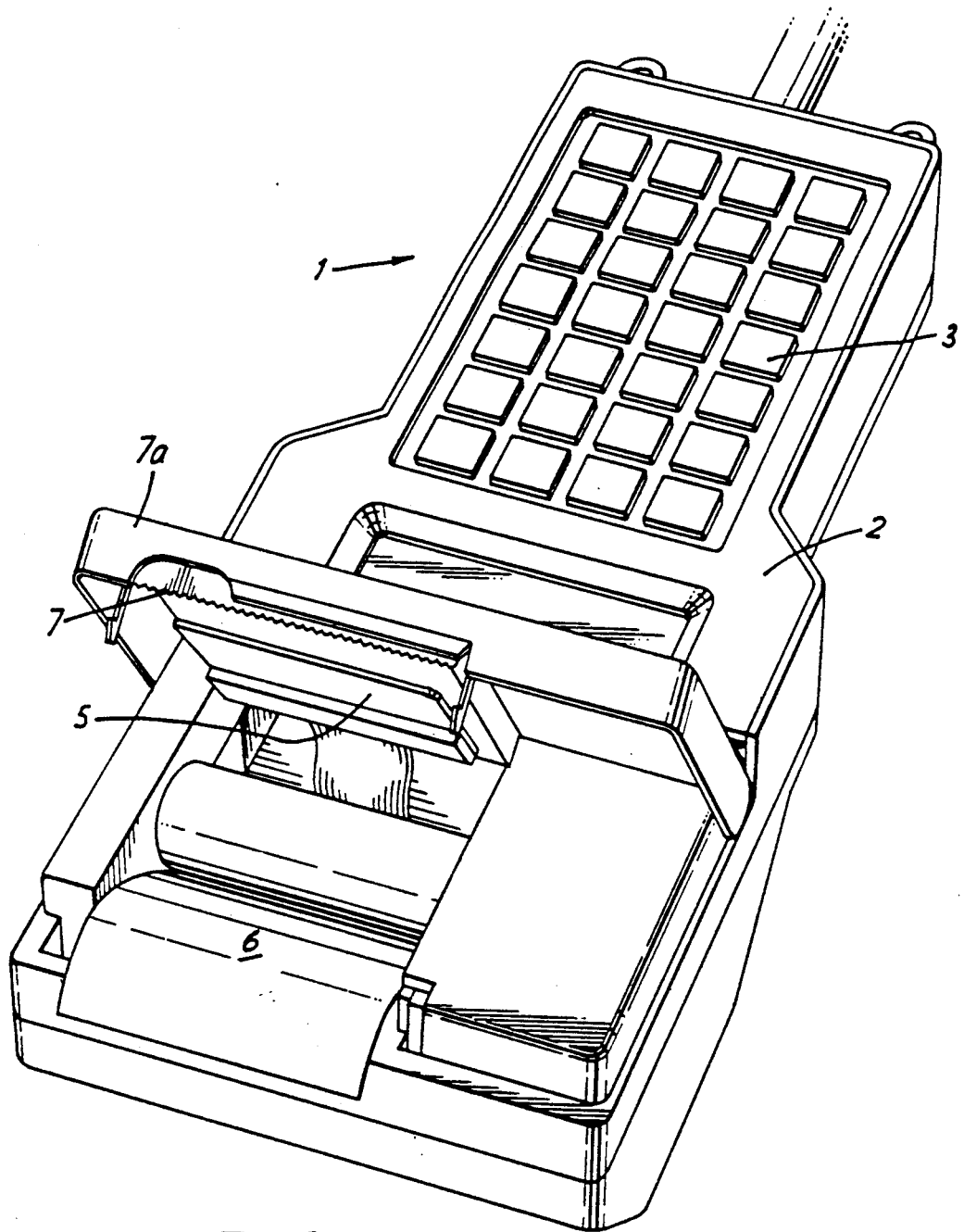
FIG. 2 is a view of the rear side of the ticket issuing machine and showing the printer.
Figure 3:
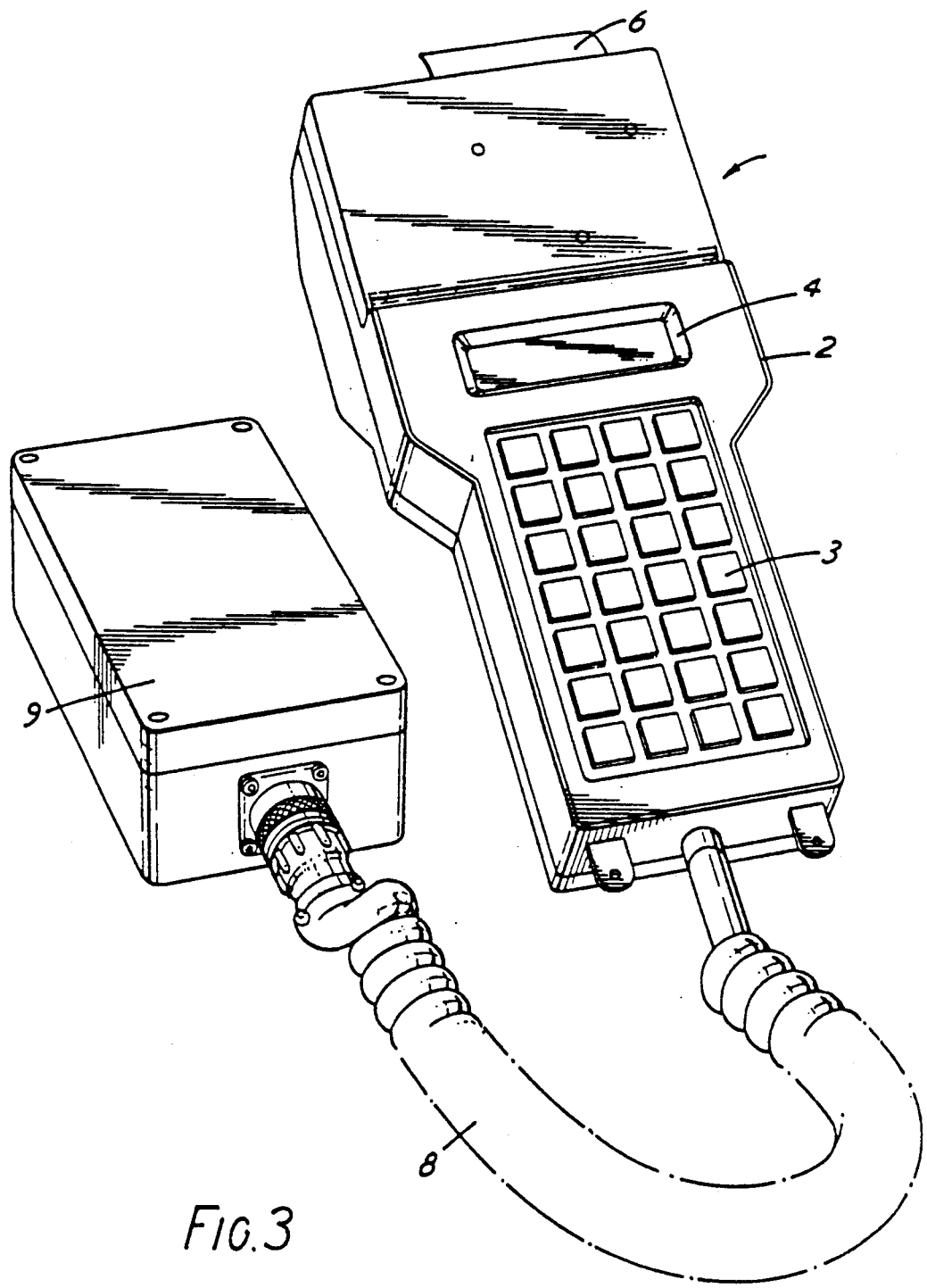
FIG. 3 is a perspective view of the ticket issuing machine connected to a battery.

Referring to FIGS. 1 to 3 of the Drawings there is shown a ticket issuing machine 1 more especially for use by a conductor travelling on a railway train to collect fares due from travellers who have not already purchased tickets at the station of boarding. The machine embodies a casing 2 including a keyboard 3, a window 4 through which the display 4a can be viewed and a thermal printer 5 which prints on thermal sensitive paper 6 to produce a ticket 6a (see FIGS. 10-14). The thermal sensitive paper 6 is fed out of the machine past a serrated edge 7 mounted on a pivoted cover member 7a. The serrated edge facilitates the tearing off of a ticket length when a ticket is printed.

As shown in FIG. 3 of the drawings the ticket issuing machine 1 is connected by a flexible connecting lead cable 8 to a rechargeable battery 8 within a casing to provide the power to drive the components and circuits of the ticket issuing machine.

As more fully described in the specification of our co-pending British patent application No. 8619187, filed Aug. 6, 1986, the battery is supported on the operator's belt and the ticket issuing machine when inoperative is supported on the operator's thigh but is readily pivoted or removed to operative position for issue of a ticket. The keyboard bears keys bearing a series of digits and character symbols as may be necessary or desirable as applied to a particular route. As best shown in FIG. 1 there are included digit keys representing the digits 0 to 9 and other symbols as follows:

| | | |
|---|---|---|
| OW | One way | Defines the special kind of ticket to be issued. If no key is depressed an ordinary single ticket is issued. |
| RT | regular round trip | |
| SR/H | Senior citizen/handicapped | |
| SD | Special Discount | |
| SE | Special Event | |
| RTX | | |
| SOUT | South Town | |
| WEST | West Town | |
| OLDT | Old Town | |
| BDY | Broadway | |
| CLEAR | Clears the Machine Memory | |
| ISSUE | Issues a ticket | |
| + | adds | |
| − | Subtracts | |
| PENTY | Penalty refers to excess fee if ticket not purchased from station | |
| TEMPAB'S | Temporary Absence | |
| CNG TRAIN | Change train | |
| DTY END | Duty End | |
| CON COUNT | Conductors Count Routine | |
| MISC CREDIT | | |
| MISC DEBIT | | |

It will be noted that some of the keys 3a bear a reference to a digit and a separate symbol or other identification. The circuiting of the machine operates by virtue of the syntax of the ticket machine operation to determine which of the characters on the key is operative as is hereinafter referred to.

Figure 4:
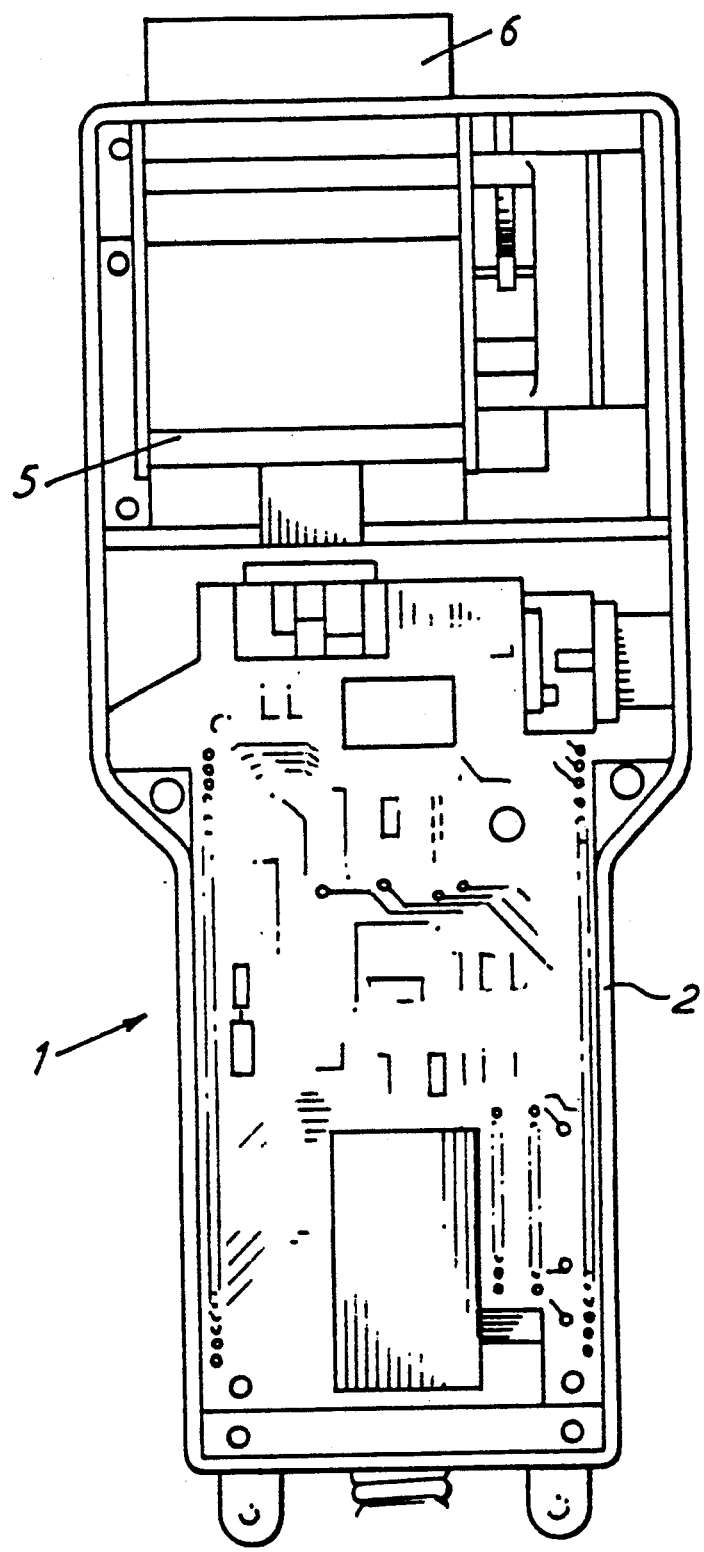
FIG. 4 is a view of the ticket issuing machine with the casing, keyboard and display removed.
Figure 5:
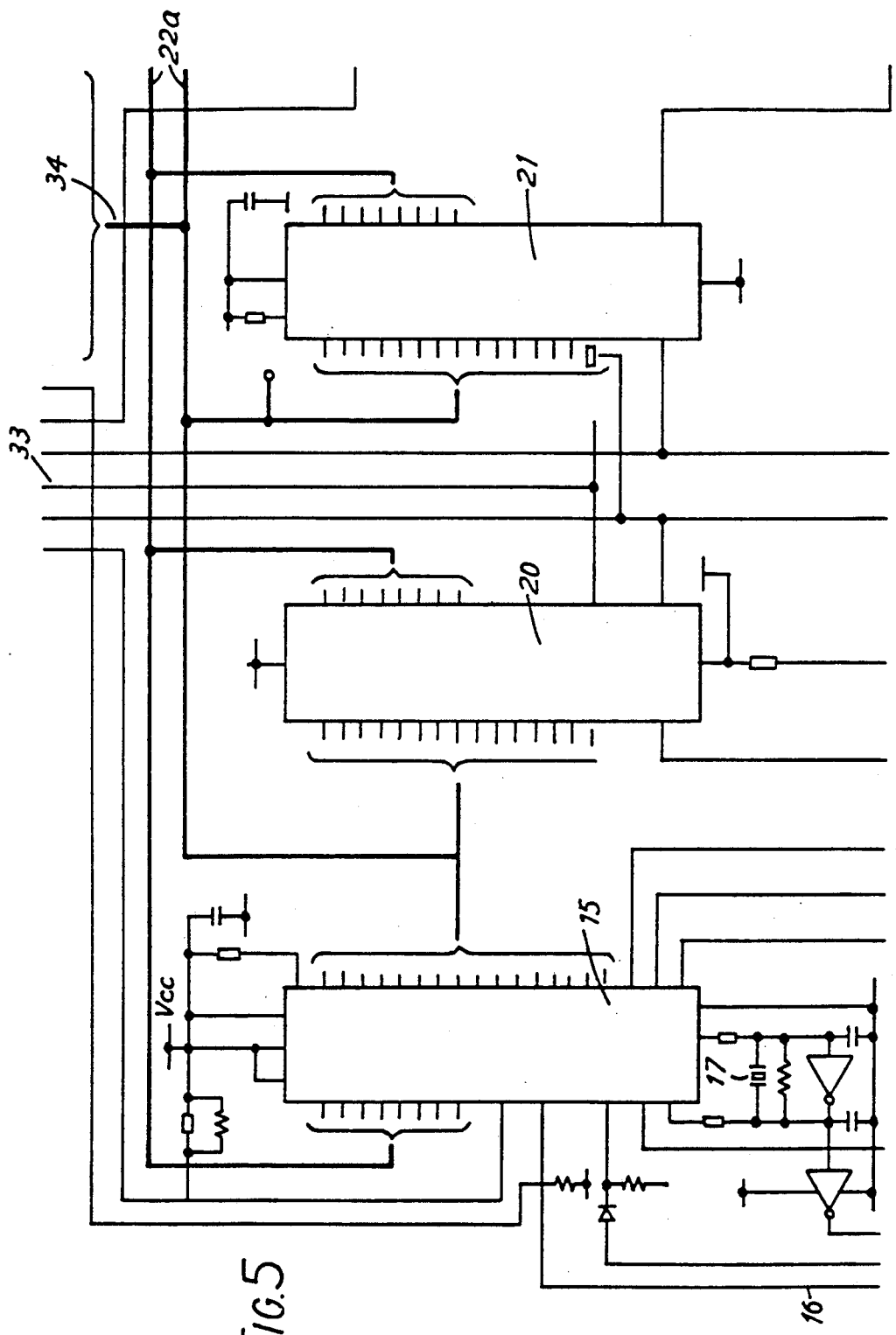
FIGS. 5, 6 and 7 are a circuit diagram of the processor circuits.
Figure 6:
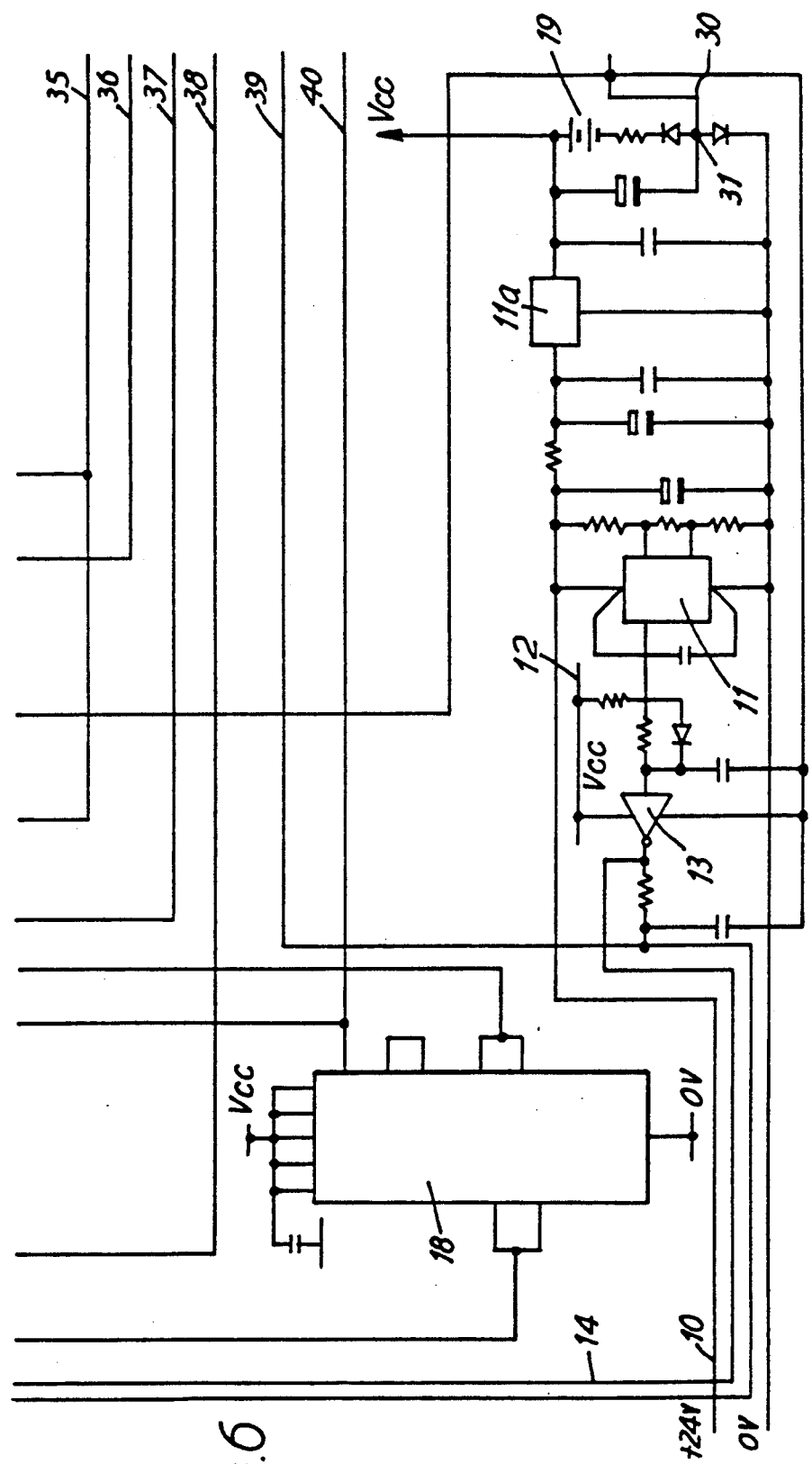
Figure 7:
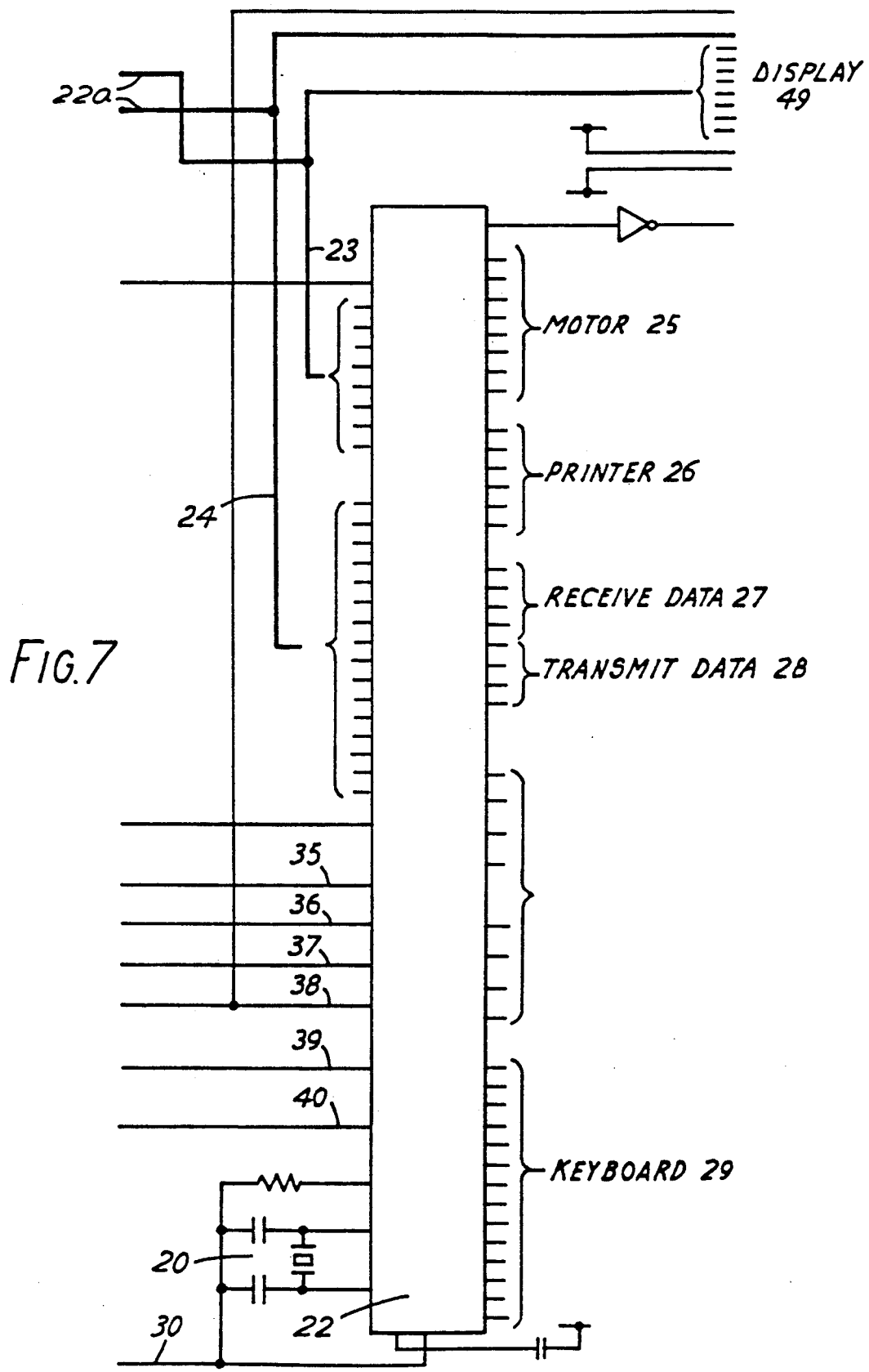

The ticket issued generally bears the character symbol of the keys but not bearing the abbreviate format. Referring to FIG. 4 of the drawings the ticket issuing machine includes the thermal printer 5 and store and gate data circuits with connections between the circuits and components as are necessary for operating the ticket issuing machine mounted within the casing 2. The circuits are arranged on two sets of boards the upper one of which is shown in FIG. 4 and connections are made between these circuits and the keyboard display and printer and external connection may be made to a computer for example when data about the sales of tickets is transferred to the computer or when data for example about fare stages and fare structures is to be changed within the ticket issuing machine. A computer referred to as the AM-4 is found to be suitable for this purpose. There is shown in FIGS. 5, 6 and 7 circuits which together make up the processor circuits of the ticket issuing machine. The power supply 10 is a 24 volt supply from the battery 9 which is applied to a voltage detector circuit 11. A connection is made to a 5 volt regulator 11a to the voltage output VCC which is arranged to supply a constant voltage supply connected to various components within the ticket issuing machine. An auxiliary battery 19 is supplied in order to supply a required voltage to the RAM and gate circuits to be hereinafter described in the event of a power failure. A connection is made from the rectifier 13 connected to the detector circuit 11 to the line 14 to give advanced warning of any power failure and this line 14 is connected to the processor circuit 15 for controlling the various components of the machine. A second line 16 serves as a reset line for the processor circuit 15.

A crystal oscillator circuit 17 supplies the train clock signal pulses to the processor circuit 15 and to the other circuits and components of the ticket issuing machine to provide the main clock pulse supply. As shown in FIG. 7 an auxiliary clock circuit 20 is provided as a real time check to show the clock time on the display and to control the operation of the ticket issuing machine before the due operating time if this should be attempted. The integrated circuit 18 is arranged to produce out of phase signals as required.

The integrated circuit 20 is a RAM circuit for data storage and has a connection for the additional battery 19 circuit to maintain the RAM circuit conditions for many years if required.

An EPROM programme memory circuit 21 is included and serves as a memory preprogrammed store of 256K bits. It is used for example to store information about fare stages, fare structures and routings. The information recorded can be duplicated so that the effective appropriate information recorded can be changed over automatically on a predefined date if this is required.

The memory circuit 21 is connected to the processor circuit 15 and to the RAM integrated circuit 20 to enable data to be transferred between the circuits. Connections are also made from the circuits 21, 15 and to a programmable data address gate array circuit 22 (FIG. 7) through lines 22a which circuit 22 serves to address the circuits to control the various components in the ticket issuing machine. The circuit 22 includes gate circuit means to identify the syntax of the signal generated by the ticket machine operation to determine which of the signals representative of the particular symbol of a key bearing more than one symbol is operative. Thus for example if considering the keys bearing a digit and a symbol by virtue of the syntax of the operation of the machine the gate switches are set to determine whether the digit or symbol is relevant at a particular time. Similarly considering the keys bearing a reference to stations the setting of the gate switches is determined by the direction of the train (for example from an inner to an outer terminus or vice versa) to determine which of the symbols on the key is relevant to a particular operation. Thus also considering the key bearing the indication CLEAR this is programmed to be operated at the start of an operation to start a machine operation on depression of the CLEAR key after the On/Off switch has been operated so that the programme of the circuits takes over. The clear key is also depressed at the end of a sequence to clear the machine of data entered. The programme of the circuits thus recognises the clear signal at one sequence to set up the programme and at another sequence to conclude the programme.

The programme of the circuits is set up to consider a command generated by operation of a key in one sense rather than operation of that key in another sense. Thus if one considers the key bearing the identifications OW (One Way) and the digit 7, at one period in the sequence of operation of the machine the one way message is relevant and at another period in the sequence of operation of the machine the digit 7 is relevant. An appropriate command for example refers to a station number. Thus referring to the Ticket shown in FIG. 14 a reference to the kind of ticket (shown as Special) would be printed at this time as ONE WAY whereas later in the syntax a reference to the digit 7 would be printed. The ticket issuing machine operates under the control of and according to the machine circuits set in accordance with the appropriate syntax and in an appropriate manner to determine which of the ticket issuing identifications on a key is relevant to the operation of the ticket issuing machine so that the appropriate identification may be entered into the ticket issuing machine when the key is depressed, without the necessity of simultaneously pressing an additional key. Similar considerations apply to the other keys with respective circuits and in accord with the syntax.

Thus connections are made from the gate array circuit 22 through lines 23 to the display 4a. The display 4a is arranged to display information in two separate lines. An additional line 24 is included to control the signals being passed to the display and determine which line of the display is to be operative for display purposes.

Connections are also made from the gate array circuit 22 to the drive motor of the printer 5 through line 25 and through line 26 to the printer 5. Furthermore lines 27 and 28 serve to receive data and transmit data into the data array circuit 22. Additionally line 29 is connected to the keyboard 3. A connection is also made through line 30 to a circuit 31 which is arranged to switch power supplied to the integrated circuits 22, 15, 20, 21 between the main battery supply and the auxiliary battery supply.

The ticket issuing machine described has a flexible connection line 32 to an external computer store (AM4) and for this purpose a series of lines 33, 34 are provided. These lines are connected to a flexible cable connection to the computer store (AM4) through a plug/socket connection in the ticket issuing machine.

A series of additional line connections are made from the gate array circuit 22 as follows:
35 line for write out control to the integrated circuit 20,
36 line is a read line also connected to the circuit 20,
37 line is an interrupt line to the processor circuit 15,
38 line is a read and write control line into the processor circuit 15,
39 line is a reset line and
40 line is a line to control the clock circuit.

Figure 8:
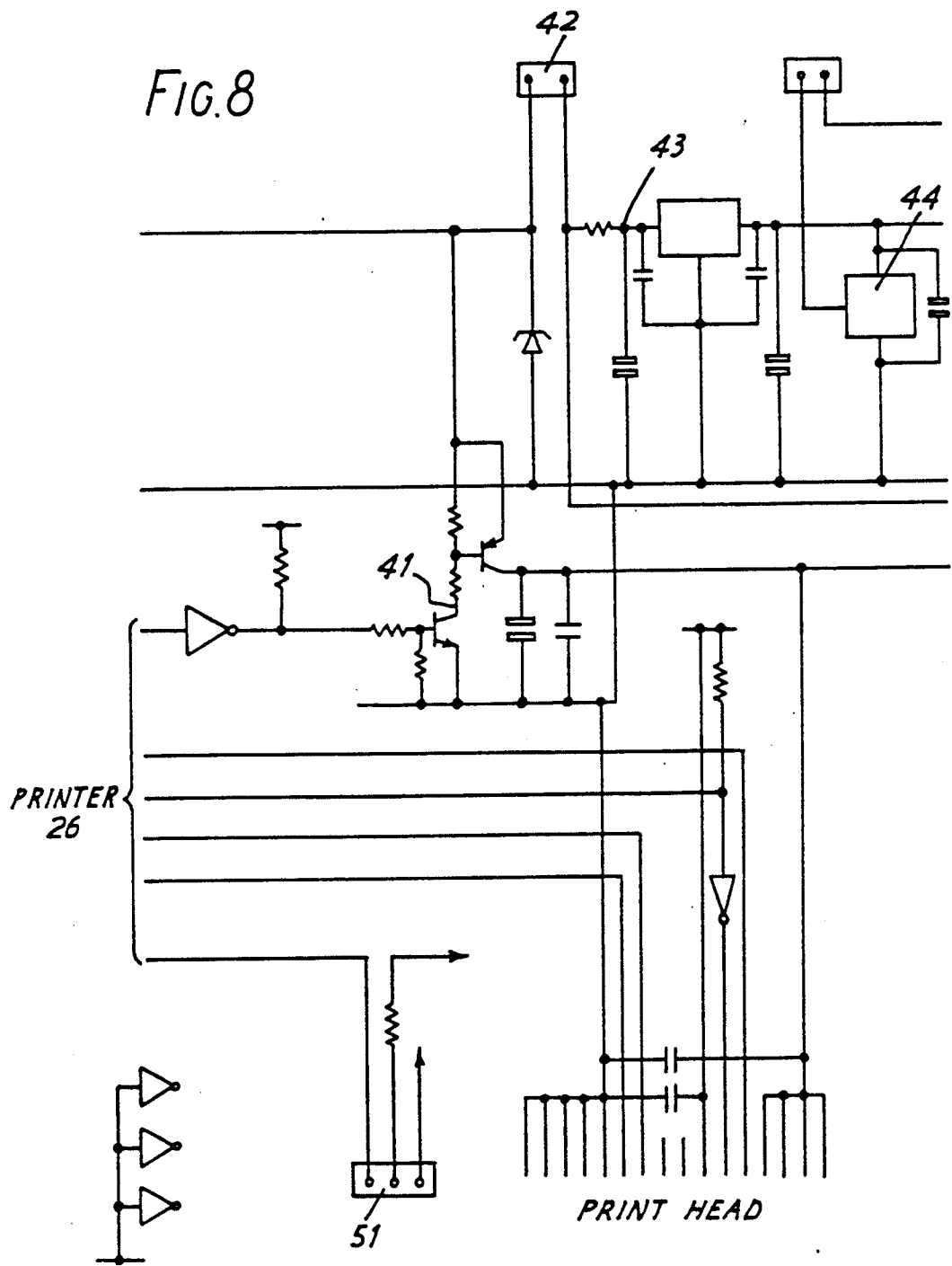
FIGS. 8 and 9 are a circuit diagram of the control circuits.
Figure 9:
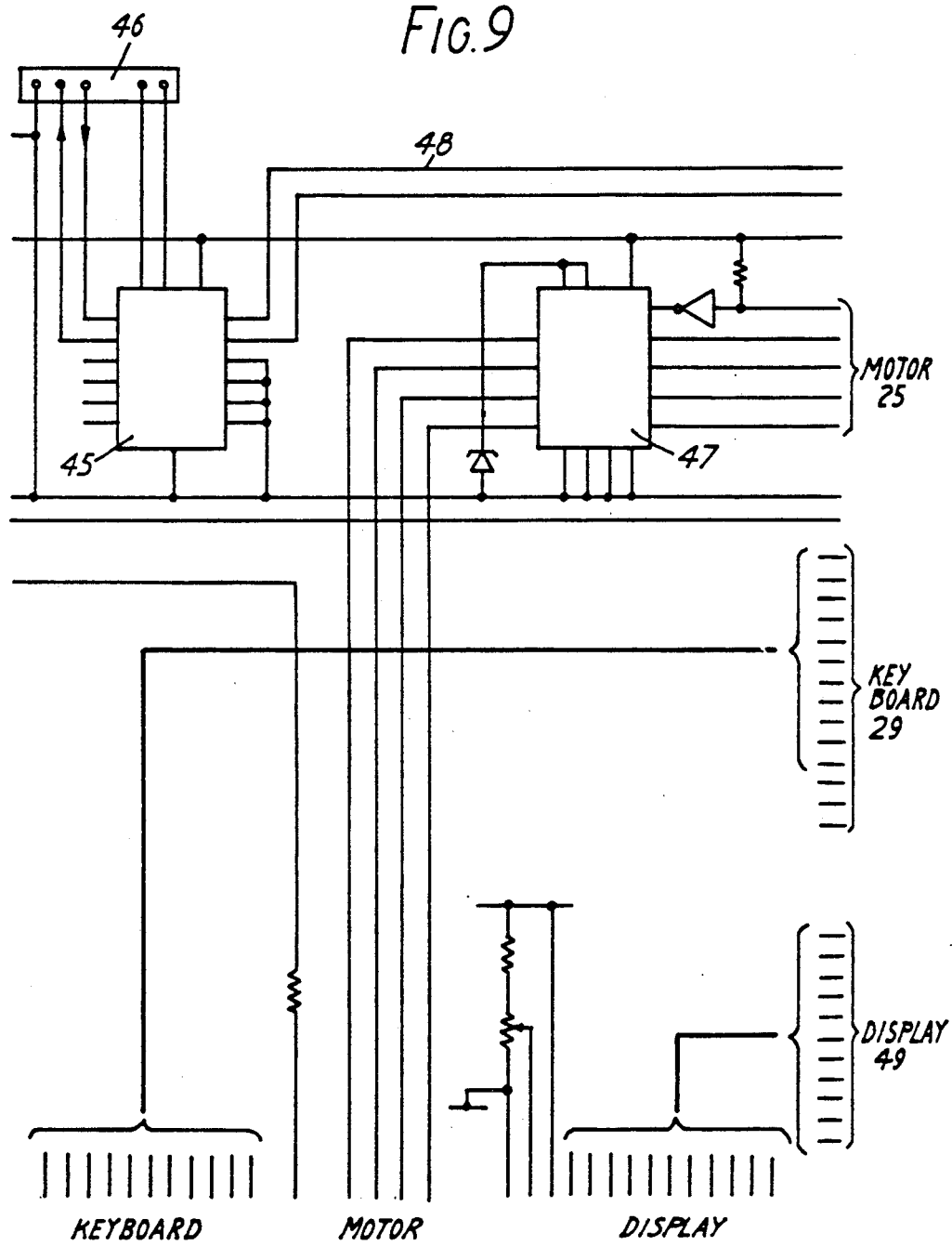

Referring to FIGS. 8 and 9 of the drawings there are shown control circuits for the ticket issuing machine. These circuits cooperate with the circuits shown in FIGS. 5, 6 and 7 which include commercially available integrated circuits but the circuits shown in FIGS. 8 and 9 are additional personalized circuits.

The circuits of FIGS. 8 and 9 include connections 26 to the printer connections of the gate array circuit 22 and include a line for serial data, a line for enable, a line for a connection to the circuit 41 which constitutes a power switch to turn off the power to the print head and the print head motor at the appropriate time.

The switch 42 is the main on/off switch connected to the main 24 volt supply and to the power supply circuit 43 to enable a conversion to a 5 volt supply to be obtained. The circuit 44 includes a high voltage inverter and serves to provide for example a 118 v supply to the display 4a. The circuit 45 FIG. 9 is an interface circuit to provide voltage connections to the computer AM4 adjusted to the correct voltage as this computer requires. The connection to the computer is through the plug connection 46. The lines 48 from the circuit 45 constitute a receive data line and a transmit data line to process signals to and from the computer AM4. The circuit 47 is a digital amplifier circuit to supply a raised current and voltage to the printer.

The lines including the motor line 25 and display line 49 are connections from the gate array circuit 22. The display connection circuits 49 are connected to the display and include additionally a potentiometer circuit which includes an adjustment so that the contrast or brilliance of the display can be varied.

A paper sensor device (not shown) is included connected to the plug 51 and arranged to give an indication when the supply of thermal paper is nearly exhausted. The ticket issuing machine includes a tuning switch mechanism to move the machine into a close down state if a transaction is not carried out in 20 seconds. The machine is also programmed to illustrate in the display certain instructional digits to the operator.

A ticket issuing machine is operable according to three levels of security:
(1) operator (conductor)
(2) supervisor
(3) Management/Audit.

Before the machine is issued to an operator it is personalized to the operator by means of an algorithm performed by the operator using an identification number and a security code inserted into the machine through the computer (AM4) unit. The algorithm calculates the Personal Identification Number of the operator which eliminates the need for authorised Personal Identification Numbers to be held in Memory. The machine as hereinbefore described is intended for use primarily by a conductor operator on a railway system to collect fares for passengers who have not already purchased tickets at the station of boarding. The operation of the machine will now be described.

I. USE BY OPERATOR

1.1. Sign-On Duty

1. Switch machine on.
2. Enter 4-digit Personal Identification Number in response to the prompt "ENTER PIN". (After 3 wrong attempts the display will prompt "call supervisor"). An * will be displayed for each PIN digit entered. A warning message will be displayed if machine data has not been downloaded.
3. Enter 4-digit run number in answer to the prompt "RUN?".
4. Enter 4 digit train number in answer to the prompt "TRAIN?".
5. Enter 2 digit route number in response to the prompt "ROUTE?".
6. Enter 3 digit origin number in response to the prompt "ORIGIN?".

The machine now displays for 5 seconds the estimated number of remaining transactions that can be stored in memory.

The machine now enters ticket selling mode indicated by the display showing the current station name.

NOTES

Pressing the "clear" key during number entry clears that number, press again or at any other time to return to the beginning of the routine.

Only valid Line Number/Origin Number combinations are accepted.

Data entry is scrolled until correct data is displayed. Enter "Yes" after the correct data is displayed to move to the next prompt.

1.2. Sign-Off Duty

1. Enter "DUTY END". Display shows "END?" and $"XXXX.XX" representing total cash. (There will be NO leading zeros).
2. Answer "YES".
3. Enter 4-digit Personal Identification Number to prompt "ENTER PIN?" (after 3 wrong attempts the display will prompt "Call Supervisor" and machine will be disabled).
4. Display shows "REMIT XXXX.XX" representing remittance to be made. Recap document is issued.
5. The unit switches off automatically after recap document is issued.

NB: Answering "NO" at step 2 will return the unit to the ticket selling mode in the state existing before "DUTY END" was entered.

In order to conserve battery power the machine closes down if not used for 20 seconds.

1.3. Duty Start Document (see FIG. 10)

One duty start document is issued after a successful sign-on for normal ticket issuing and is formatted as shown:

| | |
|---|---|
| START | The word "START" is double height, double width characters. |
| AAAA | Document Serial Number. |
| BBBB | Machine Number. |
| CC:CC | Current (Duty Start) time HH:MM. |
| DDDDDD | Date DDMMYY. |
| EEE | I.D. Number. |
| FF | Line Number of first run. |
| GGGGG | Origin Station Number of first run. |
| HHHH | Train Number. |
| JJJJ | Run Number. |
| I.D. ROUTE ORIGIN, TRAIN & RUN | Field identifiers. |

1.4. Recap Document (see FIG. 11)

A single recap document is issued at sign-off for operator information and retention and is formatted as shown:

| | |
|---|---|
| RECAP | The word "RECAP" is double height, double width characters. |
| AAAA | Document Serial Number. |
| BBBB | Machine Number. |
| CC:CC | Current (Duty End) time HH:MM. |
| DDDDDD | Date DDMMYY. |
| EEE | I.D. Number who closed Duty. |
| OOOO | I.D. Number who started Duty. |
| FFFF.FF to MMMM.MM | Sterling, Dollar or other monetary value of transactions performed (OW, SR/H, RT, SD, SE, Misc Debit and Misc Credit respectively). |
| NNNN.NN | Remittance. |
| I.D., OW, SR/H, RT, SD, SE, PENALTY,DB, MCR, REMIT | Field identifiers. |
| TTTT to YYYY | Number of transactions performed (OW, SR/H, RT, SD, SE, Penalties). |
| PPPP | Number of penalties. |
| ZZZZ | Sum of all transactions (PPPP and TTTT to YYYY). |

1.5. Temporary Absence

In the event the machine is assigned to an Operator (i.e. is "ON DUTY"), but is to be left unattended, its use may be inhibited without the need to sign-off duty, thus retaining cash accountability to the individual Operator.

1. Press temporary absence key.
2. The unit automatically switches off. To re-access the unit and continue duty operate the "ON" switch and enter 4-digit PIN to prompt "Enter Pin" This PIN is to be identical to that used to sign-on duty initially. An * will be displayed for each number entered. Entering "YES" will allow the machine to re-enter ticket selling mode.

It is not possible for another Operator to sell tickets or close down the machine once assigned to a particular Operator.

If necessary, a Supervisor or Management/Audit level person can close down the duty on behalf of the Operator by first entering (and successfully completing) the relevant access procedure, but will not be permitted to sell tickets against that Operator's duty.

1.6. Downloading Data

To download the duty data the machine must be connected to the AM-4 and must not be allocated to an Operator (i.e. must be off duty).

Figure 15:
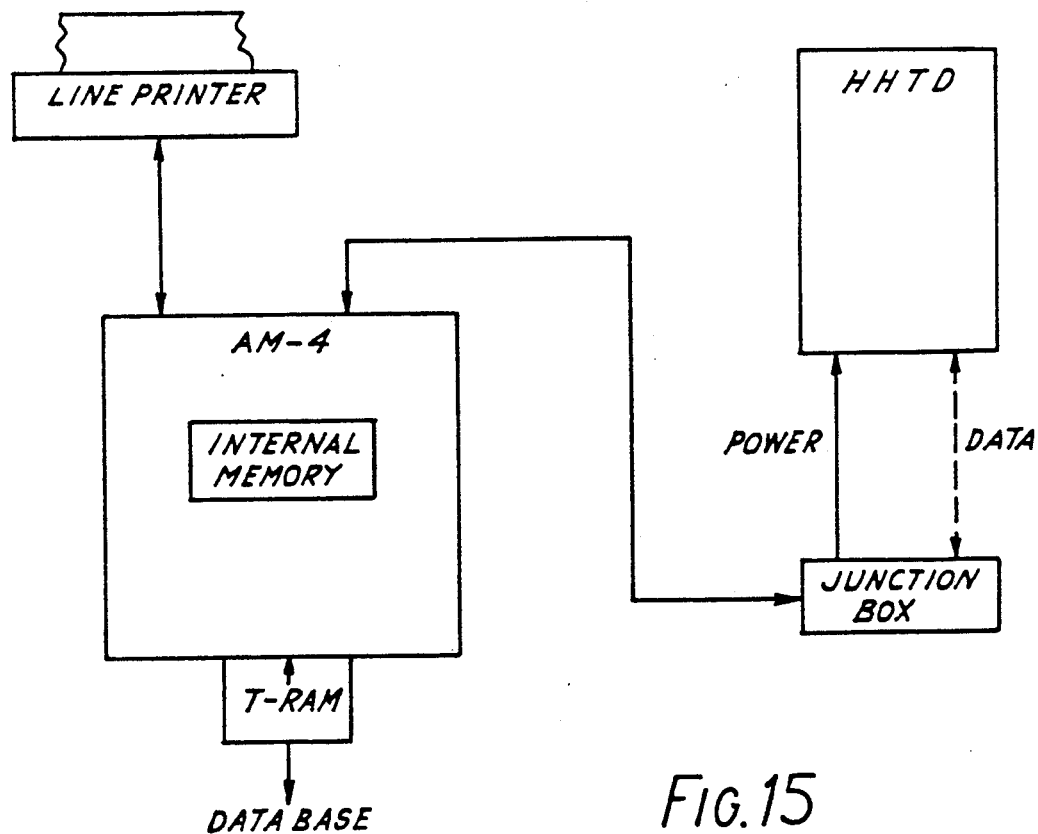
FIG. 15 is a diagram illustrating extraction of data to the AM-4 computer.

1. Disconnect the lead from the battery pack and insert into the AM-4 system.
2. Operate the "ON" switch. A data routine number may be entered to over-ride the "ON" switch.
3. Data held in memory will be downloaded by key entries at the AM-4. Display on Ticket Issuing Machine (sometimes referred to hereinafter as "TIM" or as "HHTD", as in FIG. 15) will be as defined in Section 9.

NOTES

The data routine number would be used when the Ticket Issuing Machine has to wait more than 20 seconds before downloading. After downloading data the hand held unit will retain that data in memory until it has been signed-on duty. From that point an Audit Trail (statement) of the past 10 duties is retained in memory. That audit statement will be the data of download and Revenue.

A fault statement will be displayed on the display 4a Ticket Issuing if the data is not correctly down-loaded.

1.7. Paper Changing

Paper loading is effected by pivoting the print head cover and dropping in the new paper roll. It is necessary to ensure that the end of the roll is over the paper advance roller and paper present detector. Loading is then completed by closing the print head cover.

Operator has access only to the paper roll area and the thermal print head. There are no hazardous voltages or currents in the area accessible to the Operator.

SECTION 2: SUPERVISOR PROCEDURES

This level of access is provided to allow for certain machine functions not available to normal Operators including:

Close down a duty on behalf of an Operator (e.g. in an emergency).

2.1. Close Down Duty

To enter Supervisory mode in order to close down a duty on behalf of an Operator (the machine is assumed first to be in temporary absence mode):
1. Operate "ON" switch.
2. Press "DATA" key in response to prompt "Enter PIN".
3. Enter Data Routine Number.
4. Enter 8-digit I.D./Employee/Security Number in response to prompt "SUPERVISOR?"
5. Enter 4-digit PIN in response to prompt "Enter PIN". An * will be displayed for each PIN digit entered (up to a line maximum).
6. Display shows "END?" and "XXXX.XX" representing total cash (no leading zeros).
7. Enter YES.
8. Display shows "REMIT XXXX.XX" and recap document is issued.

NOTE

If "NO" is entered at 7, an Operator temporary absence mode is assumed.

SECTION 3: MANAGEMENT/AUDIT/ENGINEER PROCEDURES

This is the highest level of access and encompasses the full range of machine functions.

The following functions are available to Management/Audit level of access only. The machine must be off duty. All functions are entered by switching on the machine in the normal way and entering "DATA" to the prompt "Enter Pin" and the required data routine number.
1. Enter 8-digit Employee I.D. number/Employee/number/Security code to prompt "Manager".
2. Enter 4-digit PIN to prompt "Enter PIN".

3.1. Advance/Retard Clock One Hour

1. Answer "YES" to prompt showing current time and "+1 HOUR?" (or "−1 HOUR?" as appropriate).
2. Display shows "READY" and revised current time.

NOTES

Entering "NO" or "CLEAR" at step 1 will revert display to "READY" and current time thereby exiting the routine without updating the time.

3.2. Reset Time, Date, Machine Number

1. Display will show current time with the left hand digit flashing. To amend the digit enter the appropriate number key. The digit will be amended and the next digit will flash until all digits have been amended. To leave a digit unamended enter "YES".
2. Display will then show current date and current Machine Number which may be amended in the same way. To leave unamended enter "YES".
3. Display shows "READY" and revised current time when function is complete.

NOTES

Entering "CLEAR" during steps 1, 2 or 3 will return to the begining of the routine allowing corrections to be made.

3.3. Memory Test

This routine both tests and clears all the machine memory. A warning message will be displayed that all fares routes, logging will be lost.
1. Answer "YES" to prompt "MEMORY TEST?"-+WARNING.
2. Display shows "PASS" or "FAIL" as appropriate. Enter "YES" to confirm.
3. Displays shows "READY" and current time.

NOTES

Entering "NO" or "CLEAR" at step 1 will revert display to "READY" and current time thereby exiting the routine.

Ticket Issuing Mode

Tickets are able to be sold only by the person to which the machine has been personalised.

The following transaction types are issued by the machine:
One Way (Adult and Half)
Senior Citizen/Handicapped
Regular Round Trip (Adult and Half)
Special Discount (all same format)
Penalty
Miscellaneous Credit
:02 Spoil
Miscellaneous Debit
:01 Step up
:02 Extension of journey

Ticket Selection

Ticket selection will follow display prompts in a similar fashion to the AM-4.

Fare calculations will be based upon the same rules as used for the AM-4, although restricted to the ticket types available.

All station names will be of the 7-character abbreviation type. All receipts and tickets will be of the single coupon type. Interbranch tickets will list the to/from points with a printed "box" between each station name which the conductor will punch each time the ticket is used for each leg of the journey. The tickets will, therefore, be of variable length.

A penalty of $1.00 is charged on all tickets bought on the train if a ticket Agent was available at the station of boarding and the passenger could have bought a normal (AM-4) ticket. This penalty is not normally applied (i.e. is not applied by default). If applied, it is shown separately on the ticket.

The following are typical ticket selection sequences:

1. One Way Adult from Terminus Town - no penalty applies, purchased on the train at Metuchen.

| REF | KEY | DISPLAY | | DISPLAY LINE |
|---|---|---|---|---|
| 1 | | NEW T | 12:45 | TOP |
| 2 | OW | OW ? | DEST'N? | BOTTOM |
| 3 | 1 | OW | 1 | BOTTOM |
| 4 | 0 | OW | 10 | BOTTOM |
| 5 | 0 | SOU T | $002.75? | BOTTOM |
| 6 | ISSUE | SOU T | $002.75 | BOTTOM |

NOTES

Step 1. Shows normal idle display. To change the origin enter "-" to decrement the station (code) as appropriate. The operator increments the station code as the journey progresses.

Step 2. A passive prompt assumes an Adult fare to be required. An active prompt requires the destination station code to be entered. To select a "Half" fare enter "NO" before entering the destination code (steps 3).

Steps 3, 4 and 5. The destination station code is entered. On selection of the last digit the display shows the destination name and the fare. The passive prompt assumes no penalty is applied. To add on the $1.00 penalty enter "PENALTY".

Step 6. Issues the ticket. Entering issue again will repeat the ticket. Enter "CLEAR" to show idle display.

2. Round Trip Half from Terminus Town to South Town, penalty applied, purchased on the train at One Avenue.

| REF | KEY | DISPLAY | | DISPLAY LINE |
|---|---|---|---|---|
| 1 | | ONE AV | 12:45 | TOP |
| 2 | — | TWO JCT | 12:45 | TOP |
| 3 | — | TERM | 12:45 | TOP |
| 4 | RTX | RTX? | DEST'N? | BOTTOM |
| 5 | NO | RTXH | DEST'N? | BOTTOM |
| 6 | 1 | RTXH | 1 | BOTTOM |
| 7 | 0 | RTXH | 10 | BOTTOM |
| 8 | 0 | SOUT | $003.65? | BOTTOM |
| 9 | PENALTY | PENALTY | $004.65 | BOTTOM |
| 10 | ISSUE | PENALTY | $004.65 | BOTTOM |

NOTES

The idle display is returned to the correct origin of Jersey Avenue by pressing "clear" or a ticket type for the next ticket.

As the train proceeds along the line, the operator simply enters "+" to increment the default origin station. The machine knows which station is next based upon its internal "map" of the rail system, coupled with the duty identifier information.

Ticket Printing (see FIG. 12)

All tickets, including interbranch are single coupon. To adequately define round trip and interbranch tickets, a list of to/from station names is printed with a box between each which the conductor will punch on the relevant journey. Ticket printing is, where possible, kept in standard field positions and formats to aid recognition by both Conductors and passengers. A receipt is issued for One Way journeys and a ticket for Round Trip journeys.

The following is a proposed layout for the machine printing:

| RECEIPT/TICKET | The word "RECEIPT" for a one way journey or "TICKET" for a round trip. |
|---|---|
| AAAAA | Five-character field available for ticket type. Normally single height, double width characters. |
| BBBBBBB | Seven-character station name, double width (standard height) characters. |
| JJJJJJJ | Seven-character station name, double width (standard height) characters. This would be the same name as BBBBBBB if ticket issued. |
| # | Punch Box. Double width (standard height) character. |
| $CCC.CC | Fare. Includes any penalty. |
| FARE | The word "FARE" to differentiate the fare and penalty fields. |
| $1.00 | Indicates the penalty charged. $0.00 when no penalty applied. |
| PENALTY | The word "PENALTY". |
| DD:DD | Time (HH:MM). |
| EEEEE | Date (DDMMYY). |
| FFFF | Machine Number. |
| GGGG | Ticket Serial Number. |
| HHHH | I.D. Number (Operator). |

NOTES

The split line shown in the ticket shown in FIG. 12 indicates that additional stations names and punch boxes may be inserted as required for round trip and interbranch tickets. (Ticket length will therefore increase).

Figure 13:
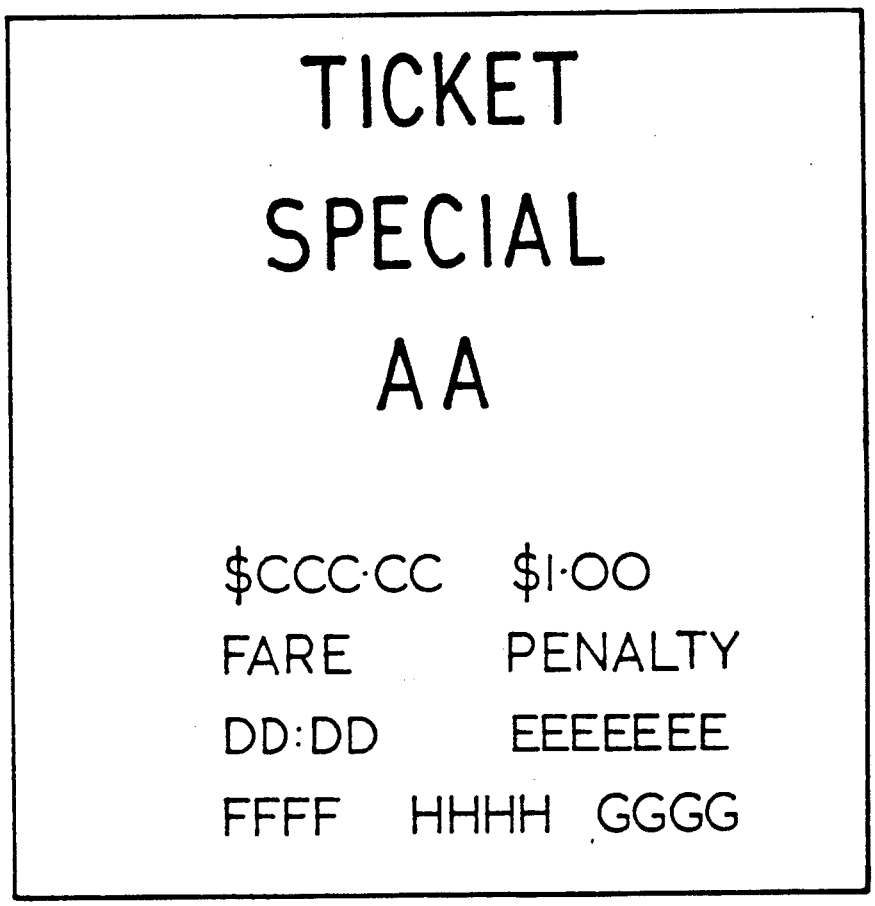

Special Tickets (See FIG. 13)

Simple codified special tickets are used to register special sales into the equipment, the code number used relating to the particular variant issued. In addition, the Conductor would key-in the relevant Sterling, Dollar or other monetary amount rather than the fare being calculated by the machine.

Eventually, for the final production machines, full special ticketing will be available to compliment that of the AM-4.

The following is a typical selection sequence:

| REF | KEY | DISPLAY | |
|---|---|---|---|
| 1. | | NEW TOWN | 12:45 |
| 2. | SD | SD ? | |
| 3. | 2 | SD 2 | |
| 4. | 3 | SD 23 | $? |
| 5. | 1 | SD 23 | $001 |
| 6. | . | SD 23 | $001. |
| 7. | 5 | SD 23 | $001.5 |
| 8. | 0 | SD 23 | $001.50? |
| 9. | ISSUE | SD 23 | $001.50 |

Steps 1, 2, 3 and 4 identify required special transaction type.

Steps 5, 6, 7 and 8 enter transaction value.

Step 9 issues ticket. Entering "PENALTY" at step 9 prior to issue would apply the penalty to fare.

The following is a proposed layout for machine printing of special tickets:

| | |
|---|---|
| TICKET | Printed in double height, double width character. |
| SPECIAL | The word "SPECIAL" to appear once on the ticket in double height, double width characters. |
| AA | Code number assigned to represent a given transaction, printed in double height, double width characters. |
| $CCC.CC | Fare value (includes any penalty). |
| $1.00 | Penalty fare if applied or $0.00. |
| FARE | The word "FARE". |
| PENALTY | The word "PENALTY". |
| DD:DD | Time (HH:MM). |
| EEEEEE | Date (DDMMYY). |
| FFFF | Machine Number. |
| GGGG | Ticket Serial Number. |
| HHH | I.D. Number (Operator). |

Rapid Station Number Keys

SOU/WES and OLD T/ keys produce rapid entry of the 3 digit Station Number with a single key:

| | | |
|---|---|---|
| On South Town division: | SOU/WES = 001 SOUT | |
| | OLDT/BO = 000 OLD T | |
| On West Town division: | SOU/WES = 999 WEST TOWN | |
| | OLDT/BO = 070 BROADWAY | |

They can be used to replace the normal 3-digit keys when entering a destination for a ticket or an origin during sign-on.

They can also be used instead of the "−" key to step back the origin station.

Spoilt Ticket Routine

To spoil a ticket the following routine is followed:
1. Enter "MISC CREDIT".
2. Display shows "MISC CREDIT".
3. Enter "02".
4. Enter ticket number to the prompt "TICKET".
5. Carry out the requested ticket selection routine as for normal issue.

Step Up Routine

When an excess fare has to be charged to an existing ticket, the ticket number and value of the excess fare can be stored in memory by the following routine:
1. Enter "MISC DEBIT".
2. Display shows "Misc Debit".
3. Enter "01".
4. Enter $"XXXX.XX" to prompt "VALUE?".
5. Enter "YES" if display value correct.
6. Display will show current station and time and HHTD will print a receipt as proposed in diagram 5. Proposed characters for the receipt are as follows:

| | |
|---|---|
| RECEIPT | The word "RECEIPT" printed in double width characters. |
| STEP UP | The word "STEP UP" in double height, double width characters. |
| TICKET | The word "TICKET". |
| CCCCC | The serial number. |
| $XXX.XX | The fare. |
| FARE | The word "FARE". |
| DD:DD | Time (HH:MM). |
| EEEEEE | Date (DDMMYY). |
| FFFF | Machine Number. |
| GGGG | Ticket serial number. |
| HHH | ID Number. |

Extension Of Journey

When a journey extension has to be charged to an existing ticket, the ticket number and value of the excess fare can be stored in memory by the following routine:
1. Enter "MISC DEBIT".
2. Display shows "MISC DEBIT".
3. Enter "02".
4. Enter $"XXXX.XX" to the prompt "VALUE?".
5. Enter "YES" if display value correct.
6. Display will show current station and time and HHTD will print a receipt as proposed in diagram 5. Proposed characters for the receipt are as follows:

| | |
|---|---|
| RECEIPT | This will be machine printed to reduce ticket stock. Printed in double width characters. |
| EXTENSION | To be in double height, double width characters. |
| TICKET | To be in standard characters. |
| CCCCC | To be in standard characters. |
| $XXX.XX | To be in standard characters. |
| FARE | To be in standard characters. |
| DD:DD | Time (HH:MM) in standard characters. |
| EEEEEE | Date (DDMMYY) in standard characters. |
| FFFF | Machine number in standard characters. |
| GGGG | Ticket serial number in standard characters. |
| HHH | I.D. Number in standard characters. |

SECTION 6: DUTY PROCEDURES

Changing The Default Origin Station

As the train progresses along its route the current station (shown on the idle display) may be changed by entering "+" to increment the Station Code Number.

Mid-Duty Train & Route Change

During an Operator's duty it may be necessary to change train and routes. This may be done mid-duty without the need to sign-off and on again. The event is recorded in memory, but no document is issued by the machine.
1. Press changing trains key.
2. Enter 4-digit new TRAIN number in response to prompt "TRAIN?".
3. Enter 2-digit new ROUTE number in response to "ROUTE?".
4. Enter 3-digit new ORIGIN number in response to prompt "ORIGIN?".

The machine is now re-allocated to the new train and route and re-enters ticket issuing mode by the display showing the current station name and time.

NOTE

Entering "YES" after correct data displayed moves to next prompt. Data entry is scrolled until correct data is displayed.

SECTION 7: SYSTEM INTERFACE

The system is to be designed such that it interfaces with the existing AM4/Database system with the minimum of hardware or software modifications. A number of interfacing methods have been proposed, the following appearing as the most readily workable and easily implementable.

7.1. Hardware Configuration (See FIG. 15)

The power/data lead from the Hand Held TIM is connected to a junction box which will ensure ease of connection to the AM4 system.

SECTION 8: SYSTEM FACILITIES

8.1. Personalisation of HH TIM

Before tickets can be sold a sign-on duty procedure has to be carried out, see 2.1. That procedure requires the input of a 4-digit PIN which is derived from an algorithm performed on a 8-digit number which is stored in the Ticket Issuing Machine at personalisation. This 8-digit number is uploaded to the Ticket Issuing Machine AM-4 keyboard routine.

Downloading Data

Downloading of transaction data to the AM-4 internal memory is carried out by an AM-4 keyboard routine. The downloaded information would also be stored in a T-RAM store which allows entry of data into the revenue accounting system computer.

A recap document of downloaded data is supplied by the line printer attached to the AM-4 thus confirming successful download.

Duty Scan

A duty scan can be performed on the downloaded transaction data within the AM-4 by means of the normal AM-4 keyboard routine.

Duty scan allows specific/past HHTD transaction data to be transferred to T-RAM for entry into the database system or for local analysis at database.

Uploading Data

Uploading of normal rail fares into the AM-4 remains from the 'RED' T-RAM.

By an AM-4 keyboard routine fares are transferred to the HHTD.

Figure 14:
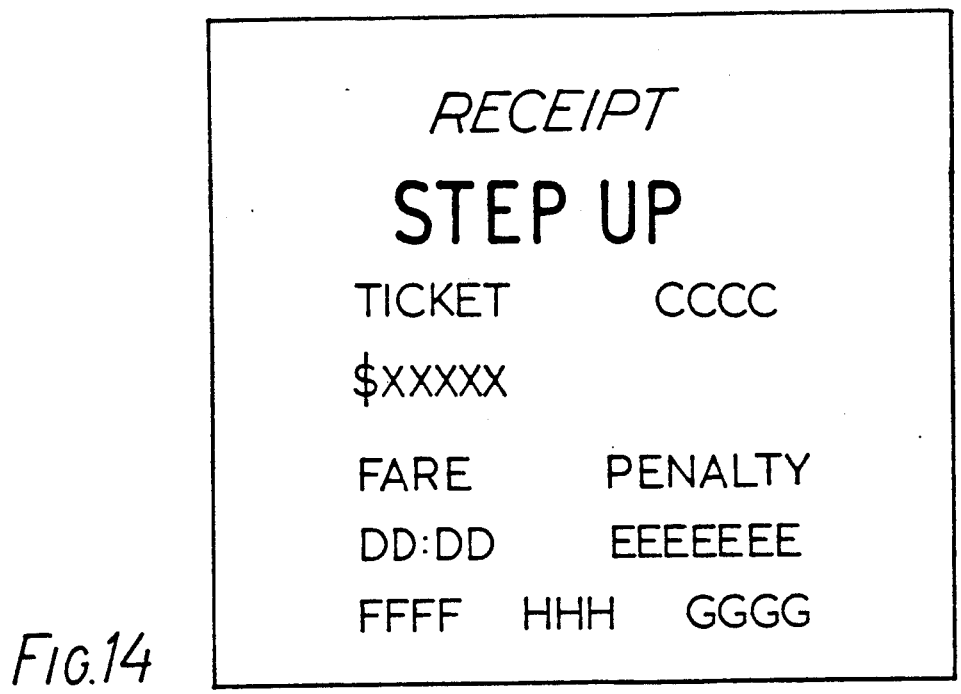

System Operation (See (FIG. 14)

Supervisor Access

Supervisor's Access on the AM-4 is achieved via the normal route.

The displayed menu is similar to that on the standard AM-4 with the addition of Ticket Issuing Machine.

Proposed display.
For Management/Audit/Engineer Security level.
THU 14:44 05/23/85 493 0408

1. S E SELECTION
2. DUTY SCAN
3. UPDATE FARES
4. SET CLOCK
5. SET MACHINE NUMBER
6. SET ORIGIN
7. MEMORY TEST
8. UPDATE CHECKS

Proposed display.
For Management/Audit/Engineer Security level.
THU 14:44 05/23/85 493 0408

9. MACHINE FUNCTIONS

Selection numbers 1 and 2 are available to Supervisor level.

Selection numbers 3-9 (inclusive) are available to Management/Audit/Engineer only.

Higher security levels are able to access all lower level functions.

Only those functions available to the particular level of access of card holder signed-on to the machine are displayed on the menu.

Standard Functions

Selection numbers 1 through 8 are as per the standard AM-4 (NJT Specification).

Select Ticket Issuing Machine functions

Press key "9". Displays Ticket Machine functions menu:
1. READ HHTD
2. FARES TO MACHINE
3. ALLOCATE MACHINE

Fares to Ticket Issuing Machine

To transfer fares to the TIM it is assumed that the AM-4 has already been loaded with the correct fare tables from a standard "RED" T-RAM using selection number 3.

The TIM is to be off duty and connected to the AM-4 via the junction box. Switch on the TIM to display prompt "Enter Pin".

It is not necessary to set up the TIM to accept fares, all instructions come from the AM-4. A data routine number is required to override the automatic close-down if not addressed by AM-4 within 20 seconds of switch-on.

AM-4 keying routine will be as follows:

| AM-4 KEY | EFFECT | AM-4 DISPLAY | MACHINE DISPLAY |
|---|---|---|---|
| 2 | Selects FARES TO MACHINE | "SEND FARES TO MACHINE" | "SECURITY?" |
| YES | Transfer Fares | "SENDING FARES" | "ON LINE" |
|  | Fares Transferred | "FARES SENT OK" (displayed for 5 secs) "SEND FARES TO HHTD?" | "SECURITY?" |

NOTE:
1. AM-4 reverts to repeat the same routine NOT to the menu as it may be necessary to update several TIM's in sequence.
2. To return to the main menu answer "NO" to prompt "SEND FARES TO MACHINE"
3. The AM-4 checks for errors whilst transferring the data and displays appropriate error messages. These stay on the display until the "CLEAR" key is pressed and a retry made by answering "YES" to "SEND FARES TO MACHINE"

| | | Personalisation, TIM | |
|---|---|---|---|
| 3 | Selects ALLOCATE MACHINE | "ALLOCATE MACHINE?" | "SECURITY?" |
| YES | Prompts for No | ENTER ID NUMBER? | "SECURITY?" |
| NNN...N | Enters 8-Digit No | ENTER ID NUMBER NNN...N | "SECURITY?" |

-continued

| | | Personalisation, TIM | |
|---|---|---|---|
| YES | Sends No to TIM Number Transferred | NUMBER SENT OK (displayed for 5 secs) ALLOCATE T-I-M | "SECURITY?" |

NOTE:
1. AM-4 reverts to repeat the same routine, NOT to the menu, as it may be necessary to personalise several TIM's in sequence.
2. To return to the menu answer "NO" to prompt "ALLOCATE T-I-M?"
3. The AM-4 checks that a valid security code digit is in the correct position in the number sequence. If not the display shows "INVALID I.D. NUMBER" and prompts for re-entry of the number.
4. The I.D. Number consists of personal I.D./Employee Number/Security Number.
5. The AM-4 checks for errors whilst transferring the data and displays appropriate error messages. These stay on the display until the "CLEAR" key is pressed and a retry made by answering "YES" to "ALLOCATE T-I-M"

| AM4 KEY | EFFECT | AM-4 DISPLAY | HHTD DISPLAY |
|---|---|---|---|
| 1 | Selects READ MACHINE | "READ MACHINE?" | "SECURITY?" |
| YES | Downloads Data Data Downloaded | "READING" MACHINE READ OK" (displayed for 5 secs) | "ON LINE" "SECURITY?" |

NOTE:
1. The AM-4 checks whether the TIM has had its current data extracted before. If this is the case the AM4 display shows "MACHINE HAS BEEN READ BEFORE" and prompts "RE-READ DATA?".
If data is to be re-read answer "YES", if not enter "NO", in which case the data will not appear in the AM-4 memory or T-RAM.
2. A label is attached to the downloaded data if it has previously been downloaded.
3. The AM-4 checks for errors whilst transferring the data and displays appropriate error messages. These stay on the display until the "CLEAR" key is pressed and a re-try made by answering "YES" to prompt "READ MACHINE?"
4. Downloaded data is held within the machine until it is personalised. An Audit trail of downloaded data only is retained after personalisation. The Audit trail is date of download and revenue.
5. Downloaded data is labelled to identify that it came from an HHTD.
6. Downloaded data is labelled to identify the time in one minute steps, sychronising with time (hours and minutes) every 10 minutes.

What is claimed is:

1. A ticket issuing machine operating with at least two particular syntaxes for issuing tickets comprising:
a keyboard for entering information into the ticket issuing machine including a plurality of keys positioned thereon, at least some of the keys including more than one different identification means indicating different ticket issuing information to be entered into the machine;
at least one store circuit for storing information relevant to tickets to be issued by the machine;
means for supplying information to specify the syntax of operation of the ticket issuing machine dependent upon information entered into the machine through the keyboard;
a printer for printing ticket information on a ticket in accordance with ticket information supplied to the printer by information supply means including the at least one store circuit and ticket information entered into said machine through said keyboard; and
at least one selection circuit for receiving the information to specify the syntax of operation of the ticket issuing machine and for identifying, based upon the particular syntax, which of the different ticket issuing information corresponding to the different identification means entered into the machine upon depressing a single key of said keys including more than one different identification means is relevant to the particular syntax operation of the machine, whereby the appropriate ticket issuing information corresponding to the particular relevant identification means desired by an operator depressing said single key is automatically entered into the machine and the inappropriate ticket issuing information corresponding to the particular irrelevant identification means not desired by the operator is rejected and not entered into the machine without the operator having to depress an additional key prior to, simultaneously with, or subsequent to depressing said single key.

2. A ticket issuing machine according to claim 1 wherein one of the identification means comprises a digit and another identification means comprises a symbol.

3. A ticket issuing machine according to claim 1 wherein a key bears more than one identification means, each identifying a station terminus on a respective line.

4. A ticket issuing machine according to claim 1 wherein the at least one selection circuit includes at least one gate circuit to reject the inappropriate ticket issuing information corresponding to the irrelevant identification means.

* * * * *